(12) United States Patent
Bollati et al.

(10) Patent No.: US 6,362,681 B1
(45) Date of Patent: Mar. 26, 2002

(54) ANALOG EQUALIZATION LOW PASS FILTER STRUCTURE

(75) Inventors: Giacomino Bollati, Castel San Giovanni (IT); Roberto Alini, Pleasanton, CA (US); Daniele Ottini, Pavia; Melchiorre Bruccoleri, Rho, both of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/461,782

(22) Filed: Dec. 15, 1999

(30) Foreign Application Priority Data

Dec. 17, 1998 (EP) .............................................. 98830760

(51) Int. Cl.[7] .................................................. H03K 5/00
(52) U.S. Cl. ........................................ 327/558; 327/552
(58) Field of Search ................................ 327/552, 103, 327/558, 336; 330/107, 105, 305

(56) References Cited

U.S. PATENT DOCUMENTS 5,576,646 A   11/1996  Rezzi et al. ................. 327/103
5,726,600 A   3/1998   Raghavan et al. ........... 327/103

OTHER PUBLICATIONS

Prodanov et al., "Biquad Gm–C Structure Which Use Double–Output Transconductors", IEEE, Aug. 13, 1995, pp. 170–173.

Primary Examiner—Dinh T. Le
(74) Attorney, Agent, or Firm—Lisa K. Jorgenson; Allen, Dyer, Doppelt, Milbrath & Gilchrist, P.A.

(57) ABSTRACT

A low pass filter with programmable equalization includes at least one biquadratic cell and a converter of the input voltage into a current, proportional to the derivative of the input voltage, that is injected on a node of the biquadratic cell to introduce two real and opposed zeros in the transfer function of the filter. The low pass filter includes two structurally similar circuits functionally connected in cascade. Each circuit includes a biquadratic cell and an input stage having two outputs injecting, through a first current output, the current to an input capacitor of the respective biquadratic cell, by a direct coupling in a first of the two circuits and in an inverted manner in the second of the two circuits. A second voltage output is coupled to an input of the respective biquadratic cell.

12 Claims, 3 Drawing Sheets

$$iz = \frac{k * s * C_z}{1 + s * C_z/gm_{Q5}} * vi$$

ANALOG EQUALIZATION LOW PASS FILTER STRUCTURE

FIELD OF THE INVENTION

The present invention relates to an analog equalization circuit for amplified signals originating from a transducer and, more particularly, to a low pass filter architecture with programmable equalization characteristics.

BACKGROUND OF THE INVENTION

In analog or digital data read/acquisition systems using transducers, after pre-amplifying the signal and eventually implementing automatic gain regulation, it is almost unavoidable to effect an equalization. This includes increasing the gain in the range of the frequency spectrum where the signal generated by a transducer has the maximum energy. The read channels of data recorded on mass memory devices, such as, for example, typical hard disk drives (HDDs), require similar processing including an analog pre-equalization which increases the read channel gain in the frequency range where the signals have the maximum energy.

Typically, the read channels perform this analog pre-equalization operation, or in any case a first part of it, by modifying the frequency response profile of a low pass filter, i.e. introducing two real and opposite zeros in transfer function. In this way, the group-delay parameter (that is the phase delay df, where f is the phase of transfer function) remains unchanged.

FIG. 1 shows the conventional structure of a biquadratic cell (BIQUAD), whose transfer function vo/vi, in the domain of the variable s (Laplace transform), is given by:

$$\frac{vo}{vi} = \frac{gm_{Q1}/gm_{Q4}}{1 + s * C1 * gm_{Q3}/(gm_{Q2} * gm_{Q4}) + s^2 * C1 * C2/(gm_{Q2} * gm_{Q4})}$$

To simplify description, all illustrations are of a single-ended architecture, employing a bipolar transconductor device. However, as it will be evident to any skilled person, all circuits shown and described according to a single-ended embodiment may be realized also in a fully differential embodiment and may employ a transconductor of any type, for example made in CMOS technology instead of in a bipolar junction technology.

As highlighted in the scheme of FIG. 1, the two programmable real and opposed zeros are implemented by injecting on the output node of the circuit of FIG. 1, a current given by:

iz=k*s*Cz*Vi where k is the current gain of the buffer stage of the injection current iz, such to obtain the conventional circuit used in the read channels, shown in FIG. 2.

As is well known to the skilled artisan, the problem with the known circuit of FIG. 2 is to assure that the parasitic pole $gm_{Q5}/Cz$ remains securely positioned at a frequency higher than that of the other poles of the transfer function, to obtain a transfer function which, in first approximation (that is by neglecting the parasitic pole $gm_{Q5}/Cz$ if sufficiently far from the filter's band), is given by:

$$\frac{vo}{vi} = \frac{gm_{Q1}/gm_{Q4} - s^2 * C3/C2 * C1 * C2/(gm_{Q2} * gm_{Q4})}{1 + s * C1 * gm_{Q3}/(gm_{Q2} * gm_{Q4}) + s^2 * C1 * C2/(gm_{Q2} * gm_{Q4})}$$

This requirement implies a non-negligible power consumption for ensuring the above indicated condition. For the known circuit of FIG. 2, this condition may be expressed by the following inequality:

$gm_{Q5}/CZ \gg sqrt(gm_{Q2}*gMQ_4/(C1*C2)$

On the other hand, for noise immunity and matching reasons, Cz must be approximately equal to C1 and C2 and therefore $gm_{Q5}$ must be much greater than $gm_{Q2}$ and $gM_{Q4}$. By considering that the power absorbed is directly proportional to the transconductance gm of the stage, the commonly used equalization circuits, as illustrated in FIG. 2, imply a high power dissipation.

SUMMARY OF THE INVENTION

In view of the state of the art, a way to avoid such a power dissipation for keeping the parasitic poles of the transfer function of the circuit that generates two programmable real and opposed zeroes, at a frequency sufficiently higher than the frequency spectrum of the transducer signal is now provided.

This important result is obtained, according to the present invention, by providing a low pass function has two distinct and real poles, formed by two structurally similar circuits and functionally connected in cascade to one another. Each circuit comprises a biquadratic cell and an input stage having a current output and a voltage output. In order to introduce two real and opposed zeroes in the filter's transfer function, in each of the two circuits in cascade, the current output of the input stage is coupled to the node of the input capacitor of the respective biquadratic cell, directly in the first circuit and in an inverted manner in the second circuit. The voltage output of the input stage is coupled to the input of the respective biquadratic cell.

In the case of a single-ended low pass filter, the inversion of the current proportional to the derivative of the relative input voltage may be provided by a current inverting stage. In the case of a fully differential low pass filter, the necessary inversion of the injected current may be simply provided by crossing the relative connections, without the need for a current inverting stage.

BRIEF DESCRIPTION OF THE DRAWINGS

The various aspects and advantages of the invention will become even clearer through the following description of an embodiment and by referring to the attached drawings, wherein.

DETAILED DESCRIPTION OF THE PREFERRED EMBODIMENTS

Figure 3:
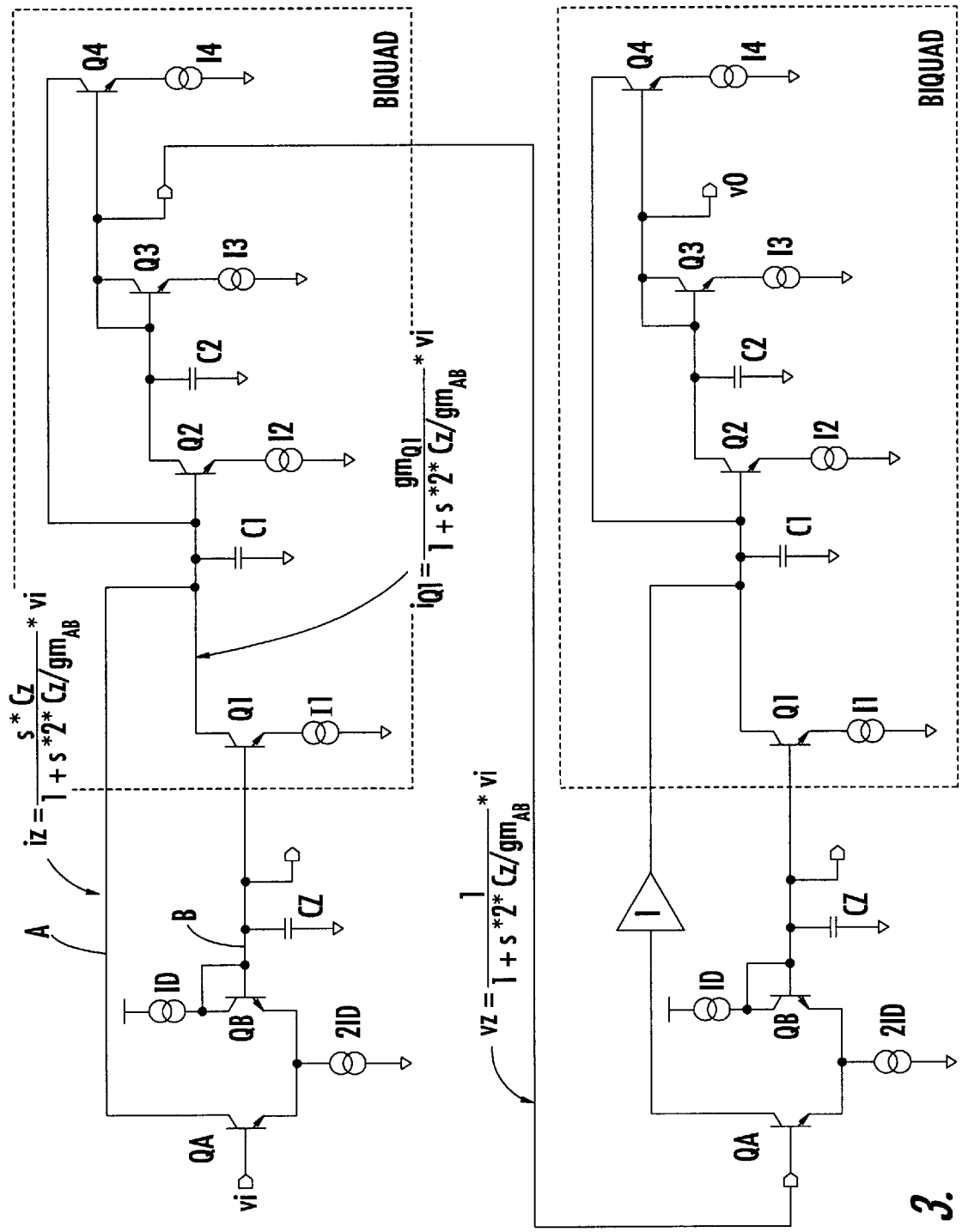
FIG. 3 is a circuit diagram of a low pass filter with programmable equalization, according to the present invention.

With reference to FIG. 3, which for simplicity's sake shows an embodiment of a low pass filter with programmable equalization according to the present invention having a single ended configuration, the low pass filter of programmable equalization of the invention is composed of two structurally similar circuits, functionally connected in cascade, whose transfer function in the domain of the Laplace transform is given by:

$$\frac{vo}{vi} = \frac{s*Cz + gm_{Q1}}{1+s*2*Cz/gm_{AB}} * \frac{1/gm_{Q4}}{1+s*C1*gm_{Q3}/(gm_{Q2}*gm_{Q4}) + s^2*C1*C2/(gm_{Q2}*gm_{Q4})}$$

Each circuit comprises a common biquadratic cell (BIQUAD) and a fully differential input stage having two outputs: A and B, respectively. The first output is a current output and the second output is a voltage output.

The current output A of the input stage is coupled to the node of the input capacitor Cl of the respective biquadratic cell BIQUAD, to inject a current proportional to the derivative of the voltage present at the stage input. As highlighted in FIG. 3, the injection of this current in the respective biquadratic cell for introducing two real and opposed zeros in the filter's transfer function, takes place by direct coupling in the first circuit, while in the second circuit such a current is preventively inverted by a common current inverter I.

Of course, should a fully differential low pass filter be required, it will be sufficient to "duplicate" the structure of FIG. 3 for both the differential output branches. In this case, the required inversion of the current injected in the relative biquadratic cell to introduce two real and opposed zeros in the transfer function, may be readily provided by crossing the relative connections between the two branches of the differential output circuit.

The second voltage output B of the input stage is coupled to the input of the respective biquadratic cell BIQUAD. The two circuits are substantially identical though there exists an inverting stage I of the current injected in the biquadratic cell of the second circuit. Each input stage includes the pair of NPN transistors, QA and QB, the bias generator 2IO and the load generator IO of the voltage output branch.

By considering the case:

$$gm_A = gm_B = gm_{AB}$$

each input stage through the output current A delivers a current given by:

$$iZ = s*CZ/(1+s*2*Cz/gm_{AB})*vi$$

where vi represents the signal present at the input of the stage, that is on the base of the transistor QA of the input stage, while the output voltage on the node B coupled to the input of the respective biquadratic cell is given by:

$$vz = 1/(1+s*2*Cz/gm_{AB})*vi$$

where, in this case, vi also represents the signal present at the input of the stage.

Figure 2:
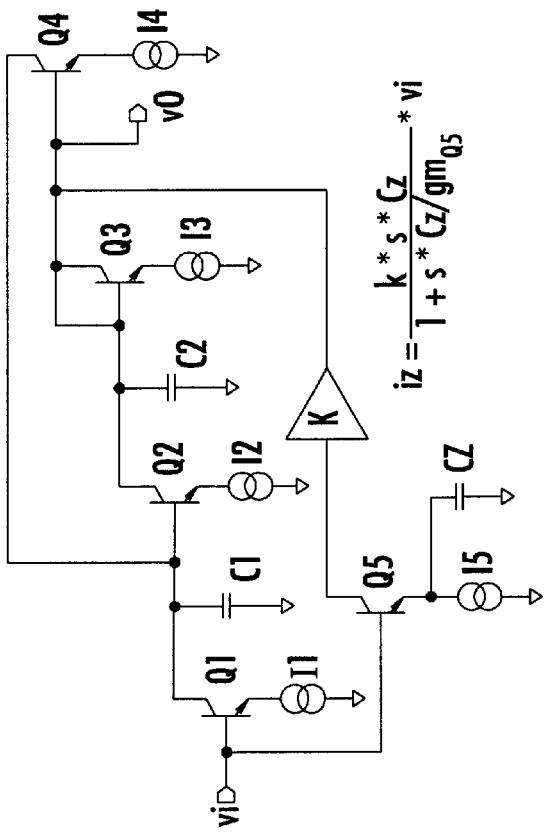
FIG. 2 is a circuit diagram of a conventional low pass filter with programmable equalization as in the prior art.
Figure 1:
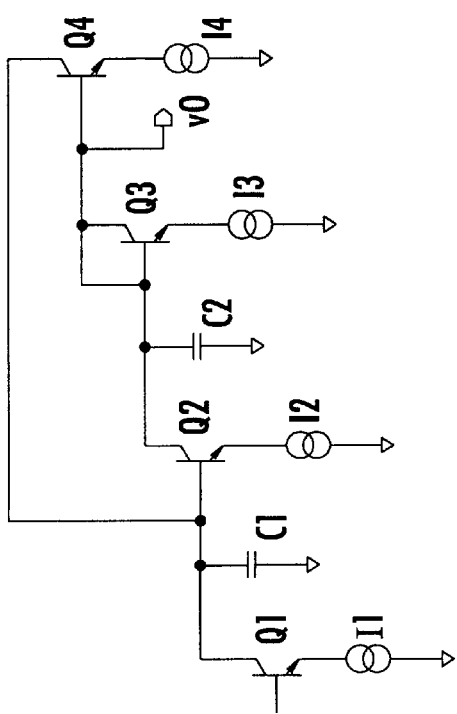
FIG. 1 is a circuit diagram of a conventional biquadratic cell as in the prior art.

The filter's boost may be programmed by modifying the zeros position, as in the known circuit of FIG. 2.

Figure 4:
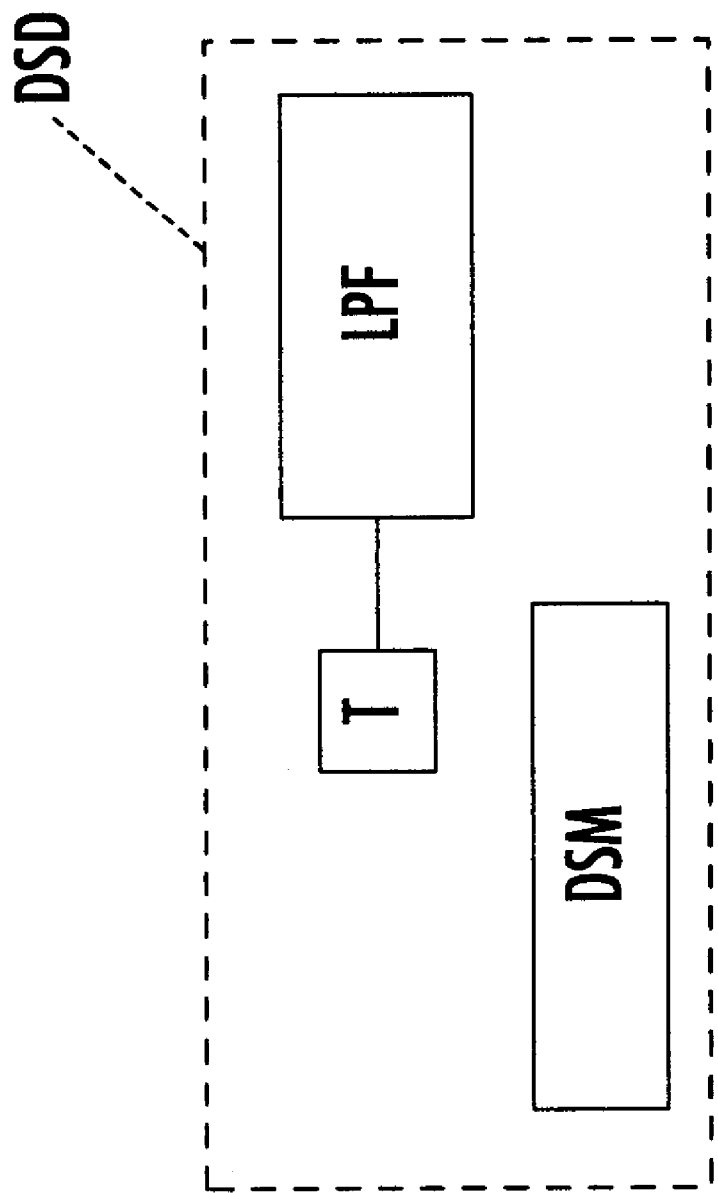
FIG. 4 is a schematic diagram illustrating a data storage device including the low pass filter of FIG. 3.

Referring to FIG. 4, a data read/acquisition system or mass memory device, such as a hard disk drive, including the low pass filter LPF of FIG. 3 will now described. The data storage device DSD includes a data storage medium DSM for storing data as is known to the skilled artisan. The data storage device DSD further includes a transducer T for reading data from the data storage medium DSM and generating a signal corresponding to the data read from the medium as is also known to the skilled artisan. Also, the data storage device DSD includes the low pass filter LPF (as shown in detail in FIG. 3) for receiving and equalizing the signal from the transducer. The low pass filter LPF and the transducer T define a read channel for transmitting the signal corresponding to data read from the medium DSM.

That which is claimed is:

1. A low pass filter with programmable equalization and having a transfer function, the low pass filter comprising:
    first and second circuits functionally connected in cascade, each circuit comprising
        a biquadratic cell including a cell input, an input capacitor and a cell output, and
        an input stage having an input, a current output and a voltage output;
    the input stage of the first circuit providing a current, proportional to a derivative of an input voltage received at the input of the input stage of the first circuit, to the input capacitor of the biquadratic cell of the first circuit through the current output of the input stage of the first circuit;
    the input stage of the second circuit providing an inverted current, proportional to the derivative of the input voltage received at the input of the input stage of the second circuit, to the input capacitor of the biquadratic cell of the second circuit through the first current output of the input stage of the second circuit; and
    the voltage output of the input stage of the first circuit being connected to the cell input of the biquadratic cell of the first circuit, the voltage output of the input stage of the second circuit being connected to the cell input of the biquadratic cell of the second circuit, the cell output of the biquadratic cell of the first circuit being connected to the input of the input stage of the second circuit.

2. A low pass filter according to claim 1, wherein the filter is a single-ended filter, and wherein the input stage of the second circuit comprises a current inverter for inverting the current provided to the respective input capacitor.

3. A low pass filter according to claim 1, wherein the filter is a differential output filter and comprises a pair of the first and second circuits connected in cascade, and wherein the inverted current injected on the respective input capacitor of each of the second circuits is provided by crossing relative connections.

4. A low pass filter comprising:
    a first circuit comprising a first biquadratic cell including a first cell input and a first input capacitor, and a first input stage having a first input, a current output and a voltage output, the first input stage providing a current, based upon an input voltage received at the first input, to the first input capacitor through the current output, the voltage output of the first input stage being connected to the first cell input of the first biquadratic cell; and
    a second circuit for receiving an output voltage from the first circuit, the second circuit comprising a second biquadratic cell including a second cell input and a second input capacitor, and a second input stage having a second input, a current output and a voltage output, the second input stage providing an inverted current, based upon the output voltage from the first circuit received at the second input, to the second input capacitor through the current output of the second input stage, the voltage output of the second input stage being connected to the second cell input of the second biquadratic cell.

5. A low pass filter according to claim 4, wherein the filter is a single-ended filter, and wherein the second input stage comprises a current inverter for inverting the current provided to the second input capacitor.

6. A differential output low pass filter comprising:

a pair of first and second circuits;

each of the first circuits comprising a first biquadratic cell including a first cell input and a first input capacitor, and a first input stage having a first input, a current output and a voltage output, the first input stage providing a current, based upon an input voltage received at the first input, to the first input capacitor through the current output, the voltage output of the first input stage being connected to the first cell input of the first biquadratic cell; and each of the second circuits receiving an output voltage from a respective first circuit, the second circuit comprising a second biquadratic cell including a second cell input and a second input capacitor, and a second input stage having a second input, a current output and a voltage output, the second input stage providing an inverted current, based upon the output voltage from the respective first circuit received at the second input, to the second input capacitor through the current output of the second input stage, the voltage output of the second input stage being connected to the second cell input of the second biquadratic cell.

7. A data storage device comprising:

a data storage medium; and a read channel for transmitting a signal corresponding to data read from the data storage medium, the read channel comprising a transducer for reading data from the data storage medium and for generating the signal corresponding to the data read from the data storage medium, and a low pass filter for equalizing the signal, and comprising a first circuit comprising a first biquadratic cell including a first cell input and a first input capacitor, and a first input stage having a first input, a current output and a voltage output, the first input stage providing a current, based upon an input voltage received at the first input, to the first input capacitor through the current output, the voltage output of the first input stage being connected to the first cell input of the first biquadratic cell, and a second circuit for receiving an output voltage from the first circuit, the second circuit comprising a second biquadratic cell including a second cell input and a second input capacitor, and a second input stage having a second input, a current output and a voltage output, the second input stage providing an inverted current, based upon the output voltage from the first circuit received at the second input, to the second input capacitor through the current output of the second input stage, the voltage output of the second input stage being connected to the second cell input of the second biquadratic cell.

8. A data storage device according to claim 7 wherein the low pass filter is a single-ended filter, and wherein the second input stage comprises a current inverter for inverting the current provided to the second input capacitor.

9. A method for introducing two real and opposed zeros in a transfer function of a low pass filter with programmable equalization, the method comprising the steps of:

providing a first circuit comprising a first biquadratic cell including a first cell input and a first input capacitor, and a first input stage having a first input, a current output and a voltage output, the first input stage providing a current, based upon an input voltage received at the first input, to the first input capacitor through the current output, the voltage output of the first input stage being connected to the first cell input of the first biquadratic cell; and providing a second circuit for receiving an output voltage from the first circuit, the second circuit comprising a second biquadratic cell including a second cell input and a second input capacitor, and a second input stage having a second input, a current output and a voltage output, the second input stage providing an inverted current, based upon the output voltage from the first circuit received at the second input, to the second input capacitor through the current output of the second input stage, the voltage output of the second input stage being connected to the second cell input of the second biquadratic cell.

10. A method according to claim 9, wherein the low pass filter is a single-ended filter, and wherein the second input stage comprises a current inverter for inverting the current provided to the second input capacitor.

11. A method for operating a low pass filter with programmable equalization, the low pass filter comprising a first circuit comprising a first biquadratic cell including a first cell input and a first input capacitor, and a first input stage having a first input, a current output and a voltage output, and a second circuit for receiving an output voltage from the first circuit, the second circuit comprising a second biquadratic cell having a second cell input and a second input capacitor, and a second input stage including a second input, a current output and a voltage output, the method comprising the steps of:

providing a current, based upon an input voltage received at the first input of the first input stage of the first circuit, to the first input capacitor through the current output of the first input stage;

connecting the voltage output of the first input stage to the first cell input of the first biquadratic cell;

providing an inverted current based upon the output voltage from the first circuit received at the second input of the second input stage of the second circuit, to the second input capacitor through the current output of the second input stage; and connecting the voltage output of the second input stage to the second cell input of the second biquadratic cell.

12. A method according to claim 11, wherein the low pass filter is a single-ended filter, and wherein the step of providing an inverted current comprises providing a current inverter for inverting the current provided to the second input capacitor.

* * * * *

UNITED STATES PATENT AND TRADEMARK OFFICE
CERTIFICATE OF CORRECTION

PATENT NO. : 6,362,681 B1
DATED : March 26, 2002
INVENTOR(S) : Giacomino Bollati, Roberto Alini, Daniele Ottini and Melchiorre Bruccoleri It is certified that error appears in the above-identified patent and that said Letters Patent is hereby corrected as shown below:

Title page,
Item [73], delete "STMicroelectronics S.R.L." insert -- STMicroelectronics S.r.l. --

Column 2,
Line 10, delete "$gm_{Q5}/Cz \gg sqrt(gm_{Q2}*gMQ_4/(C1*C2)$" insert -- $gm_{Q5}/Cz \gg sqrt(gm_{Q2}*gM_{Q4}/(C1*C2)$ --
Line 14, delete "$gM_{Q4}$" insert -- $gm_{Q4}$ --
Line 28, delete "function has two" insert -- function having two --
Line 57, delete "prior art; and" insert -- prior art; --
Lines 59-60, delete "present invention." insert -- present invention; and --

Column 3,
Line 50, delete "$iZ=s*CZ/(1+s*2*Cz/gm_{AB})*vi$" insert
-- $iz=s*Cz/(1+s*2*Cz/gm_{AB})*vi$ --

Signed and Sealed this

Third Day of September, 2002

Attest:

JAMES E. ROGAN
Attesting Officer     Director of the United States Patent and Trademark Office

UNITED STATES PATENT AND TRADEMARK OFFICE
CERTIFICATE OF CORRECTION

PATENT NO. : 6,362,681 B1
DATED : March 26, 2002
INVENTOR(S) : Giacomino Bollati, Roberto Alini, Daniele Ottini and Melchiorre Bruccoleri It is certified that error appears in the above-identified patent and that said Letters Patent is hereby corrected as shown below:

<u>Title page,</u>
Item [73], delete "STMicroelectronics S.R.L." insert -- STMicroelectronics S.r.l. --

<u>Column 2,</u>
Line 10, delete "$gm_{Q5}/Cz \gg sqrt(gm_{Q2}*gMQ_4/(C1*C2)$" insert -- $gm_{Q5}/Cz \gg sqrt(gm_{Q2}*gm_{Q4}/(C1*C2)$ --
Line 14, delete "$gM_{Q4}$" insert -- $gm_{Q4}$ --
Line 28, delete "function has two" insert -- function having two --
Line 57, delete "prior art; and" insert -- prior art; --
Lines 59-60, delete "present invention." insert -- present invention; and --

<u>Column 3,</u>
Line 50, delete "$iZ=s*CZ/(1+s*2*Cz/gm_{AB})*vi$" insert
-- $iz=s*Cz/(1+s*2*Cz/gm_{AB})*vi$ --

This certificate supersedes Certificate of Correction issued September 3, 2002.

Signed and Sealed this

Twelfth Day of November, 2002

Attest:

Attesting Officer

JAMES E. ROGAN
Director of the United States Patent and Trademark Office